United States Patent
Seidemann et al.

(10) Patent No.: US 10,714,455 B2
(45) Date of Patent: Jul. 14, 2020

(54) INTEGRATED CIRCUIT PACKAGE ASSEMBLIES INCLUDING A CHIP RECESS

(71) Applicant: Intel IP Corporation, Santa Clara, CA (US)

(72) Inventors: Georg Seidemann, Landshut (DE); Klaus Reingruber, Langquaid (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/215,449

(22) Filed: Dec. 10, 2018

(65) Prior Publication Data
US 2019/0109120 A1    Apr. 11, 2019

Related U.S. Application Data

(62) Division of application No. 15/199,434, filed on Jun. 30, 2016, now Pat. No. 10,186,499.

(51) Int. Cl.
*H01L 25/065*    (2006.01)
*H01L 23/00*    (2006.01)
(Continued)

(52) U.S. Cl.
CPC .... *H01L 25/0657* (2013.01); *H01L 23/49833* (2013.01); *H01L 24/20* (2013.01);
(Continued)

(58) Field of Classification Search
CPC ... H01L 25/0657; H01L 25/105; H01L 25/50; H01L 23/49833; H01L 23/49816;
(Continued)

(56) References Cited

U.S. PATENT DOCUMENTS 7,807,512 B2    10/2010    Lee et al.
8,278,746 B2    10/2012    Ding et al.
(Continued)

FOREIGN PATENT DOCUMENTS

JP    2007-214152    8/2007
KR    2010-0030496    3/2010
(Continued)

OTHER PUBLICATIONS

Final Office Action for U.S. Appl. No. 15/199,434 dated Oct. 10, 2017.
(Continued)

*Primary Examiner* — Dao H Nguyen
(74) *Attorney, Agent, or Firm* — Green, Howard & Mughal LLP.

(57) ABSTRACT

IC package assemblies including a molding compound in which an IC chip surface is recessed relative to the molding compound. Thickness of the IC chip may be reduced relative to its thickness during the molding process. Another IC chip, heat spreader, etc. may then occupy the resultant recess framed by the molding compound to achieve a fine stacking pitch. In some embodiments, a package-on-package (PoP) assembly includes a center-molded IC chip flip-chip-bonded to a first package substrate. A second substrate to which a second IC chip is flip-chip bonded is then electrically coupled to the first substrate by through-molding vias. Within the PoP assembly, the second IC chip may be disposed back-to-back with the center-molded IC chip so as to occupy the recess framed by the molding compound.

17 Claims, 8 Drawing Sheets

(51) Int. Cl.
- *H01L 25/10* (2006.01)
- *H01L 23/498* (2006.01)
- *H01L 25/00* (2006.01)
- *H01L 23/367* (2006.01)
- *H01L 23/538* (2006.01)

(52) U.S. Cl.
CPC .............. *H01L 24/96* (2013.01); *H01L 24/97* (2013.01); *H01L 25/105* (2013.01); *H01L 25/50* (2013.01); H01L 23/367 (2013.01); H01L 23/49816 (2013.01); H01L 23/49827 (2013.01); H01L 23/5384 (2013.01); H01L 23/5385 (2013.01); H01L 2224/12105 (2013.01); H01L 2224/16145 (2013.01); H01L 2224/16227 (2013.01); H01L 2224/48145 (2013.01); H01L 2224/73259 (2013.01); H01L 2224/73277 (2013.01); H01L 2225/06506 (2013.01); H01L 2225/06513 (2013.01); H01L 2225/06548 (2013.01); H01L 2225/06555 (2013.01); H01L 2225/06568 (2013.01); H01L 2225/06582 (2013.01); H01L 2225/06589 (2013.01); H01L 2225/1035 (2013.01); H01L 2225/1058 (2013.01); H01L 2225/1094 (2013.01); H01L 2924/14 (2013.01); H01L 2924/1432 (2013.01); H01L 2924/1434 (2013.01); H01L 2924/1436 (2013.01); H01L 2924/1438 (2013.01); H01L 2924/1461 (2013.01); H01L 2924/15311 (2013.01); H01L 2924/15321 (2013.01)

(58) Field of Classification Search
CPC ........... H01L 23/49827; H01L 23/5385; H01L 23/5384; H01L 23/367; H01L 24/97; H01L 24/96; H01L 24/20; H01L 21/568; H01L 21/56; H01L 21/6835
USPC ........ 257/686, 659, 692, 706, 777, E23.023, 257/E23.141, E23.169, E25.013, E25.023, 257/E25.029, E21.001, E21.499, E21.502, 257/E21.509, E21.599; 438/127, 107, 438/109, 113, 121, 124
See application file for complete search history.

(56) References Cited

U.S. PATENT DOCUMENTS

| | | |
|---|---|---|
| 9,064,859 B2 * | 6/2015 | Chi ..................... H01L 21/4832 |
| 9,087,835 B2 | 7/2015 | Sutardja et al. |
| 9,385,006 B2 | 7/2016 | Lin et al. |
| 10,062,583 B2 * | 8/2018 | Costa .................... H01L 23/645 |
| 2002/0127780 A1 * | 9/2002 | Ma ........................ H01L 21/561 438/127 |
| 2007/0029683 A1 | 2/2007 | Tsai et al. |
| 2010/0244208 A1 * | 9/2010 | Pagaila ................. H01L 21/568 257/659 |
| 2011/0266652 A1 | 11/2011 | Do et al. |
| 2011/0278741 A1 | 11/2011 | Chua et al. |
| 2013/0049205 A1 * | 2/2013 | Meyer ................. H01L 23/3107 257/773 |
| 2013/0221543 A1 | 8/2013 | Choi et al. |
| 2013/0241080 A1 | 9/2013 | Pagaila |
| 2013/0290054 A1 | 10/2013 | Jung et al. |
| 2013/0295720 A1 | 11/2013 | Fuergut et al. |
| 2014/0084442 A1 | 3/2014 | Lee et al. |
| 2014/0353821 A1 | 12/2014 | Yu |
| 2014/0367839 A1 | 12/2014 | Choi et al. |
| 2016/0100489 A1 * | 4/2016 | Costa ...................... H01F 27/24 361/764 |
| 2016/0133538 A1 | 5/2016 | Yu et al. |
| 2016/0148909 A1 | 5/2016 | Chung et al. |
| 2016/0260689 A1 * | 9/2016 | Meyer ...................... H01L 21/54 |
| 2016/0343592 A1 * | 11/2016 | Costa .................. H01L 23/3135 |
| 2017/0358511 A1 * | 12/2017 | Costa .................. H01L 23/3135 |

FOREIGN PATENT DOCUMENTS

| | | |
|---|---|---|
| KR | 20120045214 | 5/2012 |
| KR | 2014-0141927 | 12/2014 |

OTHER PUBLICATIONS

International Search Report and Written Opinion for International Patent Application No. PCT/US17/35047, dated Sep. 8, 2017.
Non-Final Office Action for U.S. Appl. No. 15/199,434, dated Apr. 11, 2017.
Notice of Allowance for U.S. Appl. No. 15/199,434, dated Sep. 21, 2018.
Office Action for U.S. Appl. No. 15/199,434, dated Mar. 27, 2018.
Restriction Requirement for U.S. Appl. No. 15/199,434, dated Jan. 19, 2017.
International Preliminary Report on Patentability for International Patent Application No. PCT/US17/35047, dated Jan. 10, 2019.
Extended European Search Report for EP Patent Application No. 17820802.1, dated Dec. 3, 2019.

* cited by examiner

INTEGRATED CIRCUIT PACKAGE ASSEMBLIES INCLUDING A CHIP RECESS

CLAIM FOR PRIORITY

This application is a divisional of and claims priority to U.S. patent application Ser. No. 15/199,434, filed on Jun. 30, 2016 and titled "Integrated Circuit Package Assemblies Including a Chip Recess", which is incorporated by reference in its entirety.

BACKGROUND

There are many integrated circuits (IC) chip, or die, packaging technologies. Many advanced IC packages minimize package thickness or "z-height" and/or integrate a plurality of chips. In some applications (e.g., mobile devices), package thickness is one of the most important parameters in response to the design trend toward thinner devices. To include more features and/or spare printed circuit board (PCB) area, packaged chips may be stacked (e.g., package-on-package, or "PoP" technology). Such stacked package architectures are generally contrary to reductions in package height, and so techniques to minimize the package z-height that are compatible with package stacking technologies are all the more advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
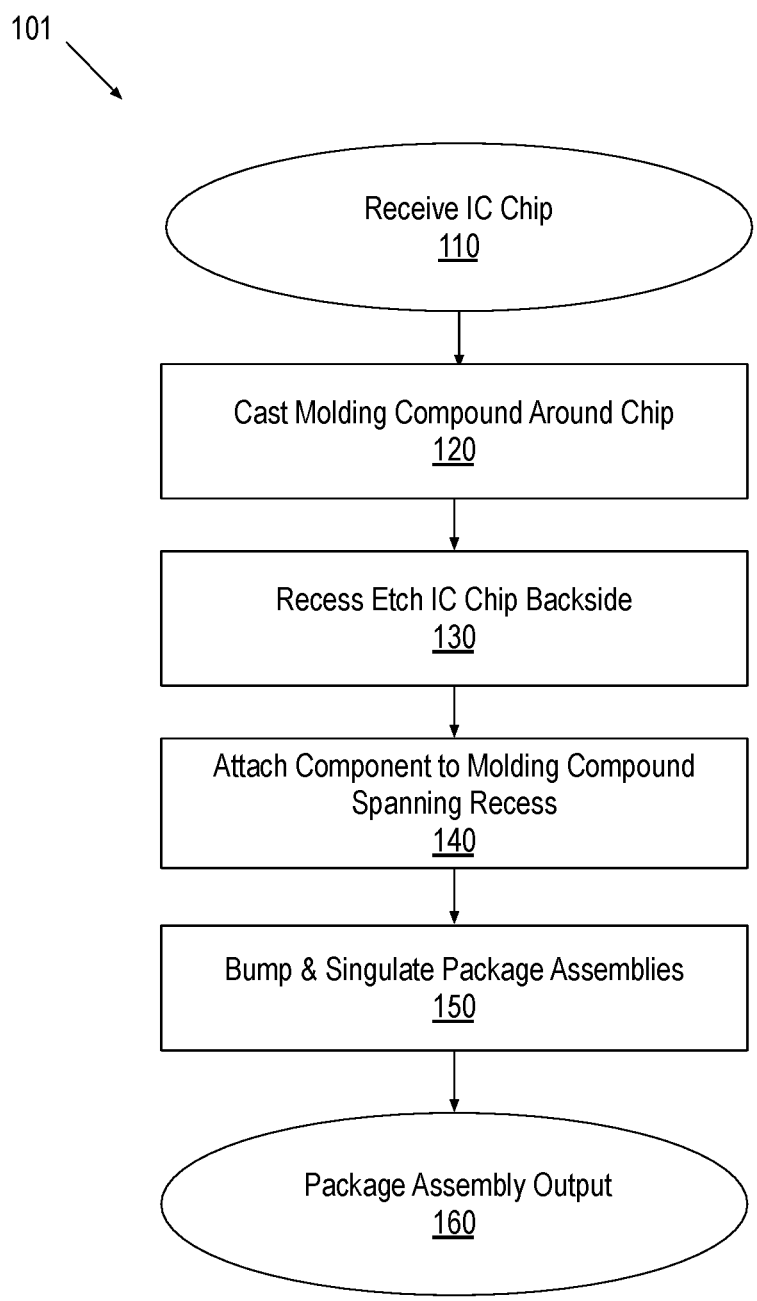
FIG. 1 is a flow diagram of chip molding and recess methods for IC packages and package assemblies, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are IC package assemblies including a molding compound in which an exposed IC chip surface is recessed relative to the molding compound, for example by an etch process performed subsequent to casting of the molding compound. The IC chip embedded within the molding compound may be thinned down from the initial packaged die thickness without the complications typical of thin die packaging. Fine pitch stacking may be achieved by positioning another IC chip, heat spreader, or other component, within the resultant recess framed by the molding compound. In some exemplary embodiments described below, a PoP assembly includes a center-molded IC chip flip-chip-bonded to a first package substrate. A second package substrate to which a second IC chip is flip-chip bonded is then electrically coupled to the first package substrate, for example by through-molding vias. Within the PoP assembly, the second IC chip may be disposed back-to-back with the center-molded IC chip so as to occupy the recess framed by the molding compound that was formed by etching a back side of the exposed center-molded IC chip.

Figure 2A:
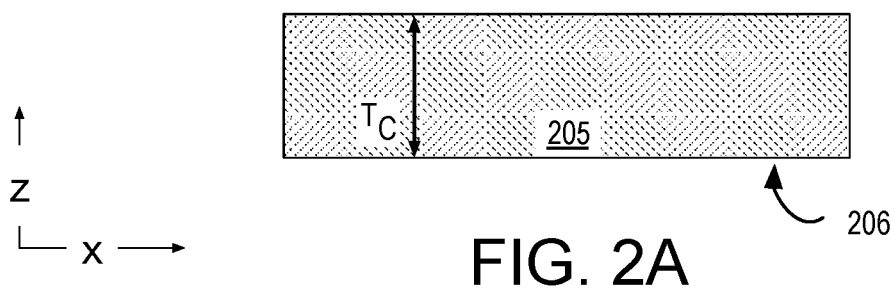
FIGS. 2A, 2B, and 2C depict cross-sectional views of a chip embedded in a molding compound and recessed relative to a surface of the molding compound as the methods illustrated in FIG. 1 are practiced, in accordance with some embodiments.
Figure 2B:
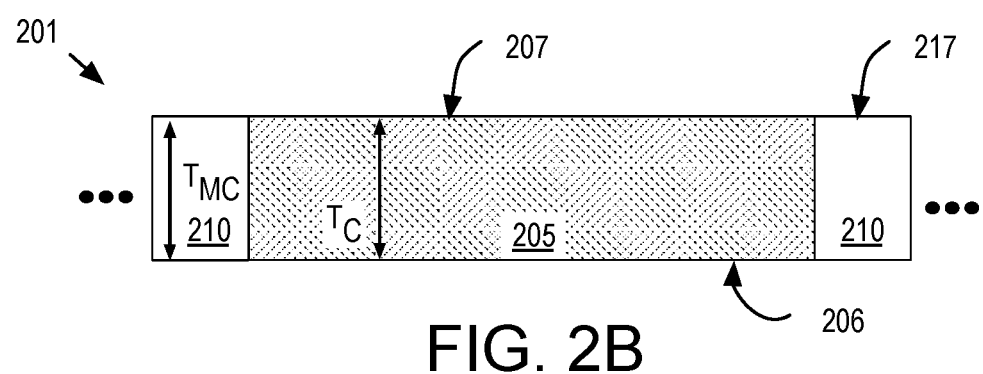
Figure 2C:
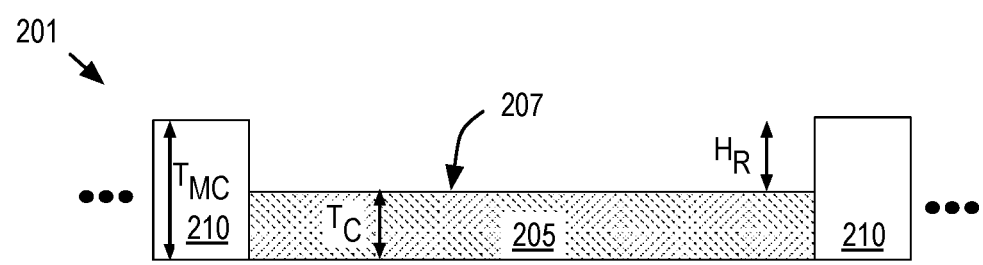

FIG. 1 is a flow diagram of a chip molding and recess methods 101 for IC packages, in accordance with some embodiments. FIGS. 2A, 2B, and 2C depict cross-sectional views of a chip embedded in a molding compound and recessed relative to a surface of the molding compound as operations in the methods 101 are practiced, in accordance with some embodiments.

Methods 101 begin with receiving an IC chip at operation 110. FIG. 2A is a cross-sectional view of an exemplary IC chip 205 that may be received at operation 110. IC chip 205 has a nominal incoming chip z-thickness $T_c$. Chip z-thickness $T_c$ may vary, for example as a function of die size, etc. In some embodiments, chip z-thickness $T_c$ is 150-600 μm, or more. At these thicknesses, upstream wafer-level processing and chip singulation pose no particular challenge as complications associated with processing an aggressively thinned die (e.g., where $T_c<100$ μm) may be avoided. IC chip 205 may include any electrical circuitry suitable for any purpose. In some embodiments, IC chip 205 includes circuitry associated with an applications processor, central processor, or graphics processor, memory array (e.g., DRAM or flash), RF transceiver, a photonic IC (PIC), microelectromechanical system (MEMs), floating point gate array (FPGA), power management IC (PMIC), image sensor, or a system-on-chip (SoC) including two or more of these. In other embodiments, the input to methods 101 is chip that has been at least partially packaged, such as, but not limited to, a system-in package (SiP). IC chip 205 includes a plurality of metal features (e.g., bond pads or lands with surface finish, such as NiPdAu or Copper Organic Solderability Preservative) disposed on IC chip front side 206. In some exemplary embodiments, IC chip 205 has been singulated from native semiconductor wafer form. In other embodiments, IC chip 205 is at least partially sawed with a deep trench forming a perimeter about the chip.

Returning to FIG. 1 at operation 120, a molding compound is cast or extruded around the IC chip. FIG. 2B is a cross-sectional view of exemplary molded IC chip package 201 that may be generated by operation 120. Molded IC chip package 201 further includes a molding compound 210, which may be any known molding compound, such as, but not limited to, an epoxy molding compound (EMC). Molding compound 210 typically includes some percentage of filler (e.g., silicon dioxide particles), and any amount of such filler may be employed as embodiments herein are not limited in this respect. Molding compound 210 is adjacent to a sidewall of IC chip 205 and in the exemplary embodiment illustrated forms a continuous frame about IC chip 205 between IC chip front side 206 and a IC chip back side 207. During the molding operation, the front side of the IC chip may be bonded to a package substrate, but need not be. Any known center-molding process may be employed with the caveat there is no overmold of the IC chip. Rather, as shown in FIG. 2B, IC chip back side 207 remains exposed upon molding, and may be substantially planar with molding compound backside 217. In the illustrative embodiment, following the molding operation, molding compound 210 has at least the same z-thickness as that of IC chip 205 (e.g., molding compound z-thickness $T_{MC}\geq$chip z-thickness $T_c$).

For some embodiments, as annotated by the ellipses in FIG. 2B, the molding operation 110 (FIG. 1), as well as other operations of method 101, may be performed for a plurality of IC chips in parallel. For example, in some embedded wafer-level-ball grid array (eWLB) package embodiments, molding operation 120 forms a reconstituted wafer in which the molding compound joins a plurality of IC chips for subsequent parallel package processing. For some other embodiments, such as for exemplary flip-chip (FC) package embodiments, molding operation 120 along with subsequent packaging operations may be performed in parallel for a plurality of IC chips in a packaging carrier (e.g., as packaging strip process) until the packages are singulated, for example by passing a saw through the regions demarked by ellipses in FIG. 2B.

Returning to FIG. 1 at operation 130, the back side of the molded IC chip is recess etched, thinning the die while the front side is protected from the etching process, for example, by the molding compound. Any recess etch process known to be suitable for thinning an IC die or wafer may be employed at operation 130. A plurality of die (e.g., in a packaging strip) may be recess etched concurrently. A wet-etch chemistry or reactive ion etch (RIE) process known to be suitable for etching the chip backside material (e.g., semiconductor) may be performed for a fixed time or until an etch stop layer is reached. One example of a suitable etch stop layer is the insulator layer of a semiconductor-on-insulator (SOI) substrate. However, other stop layers may be inserted into the chip stack (e.g., epitaxial layers, etc.) for at least the purpose of terminating operation 130 at a desired chip z-thickness. In some exemplary silicon substrate embodiments, the silicon wet-etch chemistry or silicon RIE process is highly selective to the silicon substrate relative to the molding compound (e.g., epoxy and silicon dioxide filler), causing the back side of the IC chip to recess relative to the molding compound. FIG. 2C is a cross-sectional view of the molded IC chip package 201 after chip 205 has been recess etched. As shown, IC chip 205 is now significantly thinner than molding compound 210 (e.g., molding compound z-thickness $T_{MC} \gg$ chip z-thickness $T_c$), resulting in a z-thickness step transition between molding compound 210 and IC chip 205 associated with a recess z-height $H_R$ (e.g., molding compound z-thickness $T_{MC}$=chip z-thickness $T_C$+ recess height $H_R$). In some embodiments, chip z-thickness $T_c$ may be 30-50 μm, or less, following the recess etch operation.

Figure 3A:
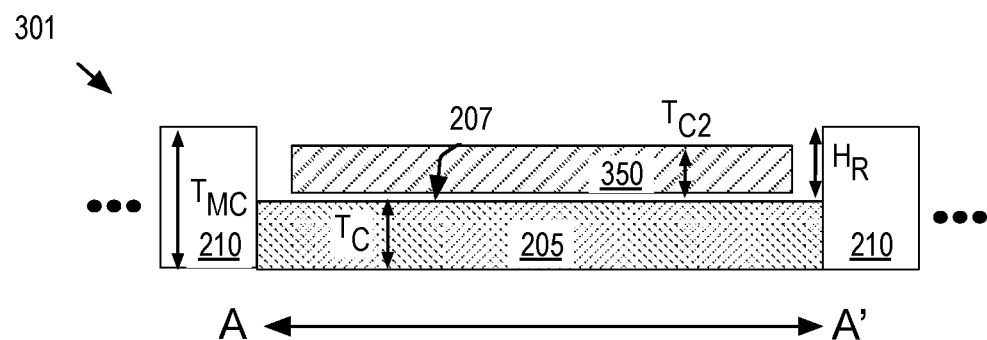
FIG. 3A depicts a cross-sectional view of a package including a recessed IC chip that may be generated by practicing the methods illustrated in FIG. 1, in accordance with some embodiments.
Figure 3B:
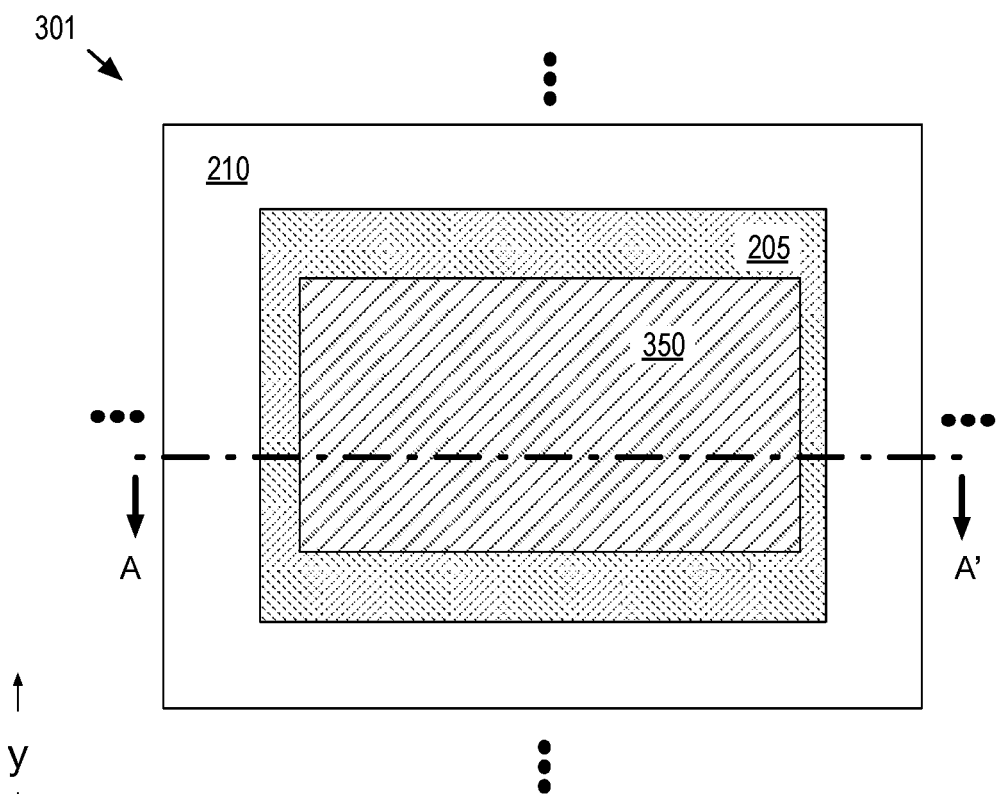
FIG. 3B depicts a plan view of a package illustrated in FIG. 2A, in accordance with some embodiments.

Returning to FIG. 1 at operation 140, a component is disposed within the recess formed over the molded IC chip. Because the molding compound has the z-thickness associated with the nominal incoming IC chip z-thickness and the IC chip has been subsequently thinned, the component stacked over the IC chip at operation 140 may, at least in part, occupy the recess now framed by the molding compound to achieve fine pitch stacking. FIG. 3A is a cross-sectional view of the molded IC chip package assembly 301 after a component 350 has been stacked over the recessed back side of chip 205. As described further below, component 350 may be second IC chip. For example, component 350 may be any of an applications processor, central processor, or graphics processor, memory array (e.g., DRAM or flash), RF transceiver, a photonic IC (PIC), optical lens, microelectromechanical system (MEMs), sensor array (e.g., CMOS image sensor), or a system-on-chip (SoC) including two or more of these circuitries. As also described further below, component 350 may also be a metal heat sink, heat spreader, heat pipe, or the like. As shown cross-section in FIG. 3A and in plan view in FIG. 3B, component 350 has a smaller area or footprint than that of IC chip 205, allowing component 350 to be positioned within the recessed package such that a stack including both IC chip 205 and component 350 is framed by molding compound 210. For the embodiment illustrated in FIG. 3A, component 350 has a component z-thickness $T_{C2}$ that is less than the recess height $H_R$. In other embodiments however, component z-thickness $T_{C2}$ may be greater than recess height $H_R$. Regardless, the stack up z-height may be effectively reduced by up to the recess height $H_R$.

Returning to FIG. 1 at operation 150, the package assemblies are bumped and singulated using any techniques known in the art to be suitable for reconstituted packaging wafers, packaging carriers (e.g., strips), or the like. Before bumping and singulation, the component package assemblies may be over molded or capped, if desired. Electrical connections to an IC chip within the assembly may be made with any known technique, such as, but not limited to, ball grid array (BGA). Electrical connections to the component stacked upon the IC chip may be made with any known technique, such as, but not limited to, wire bond (e.g., PiP) and ball grid array (e.g., PoP). Some exemplary package assemblies that may be fabricated by practicing specific embodiments of methods 101 are described further below.

Methods 101 complete with output of the packaged assembly at operation 160. The output package assembly may be subsequently mounted to a host substrate, and/or reintroduced as an input to a second iteration of methods 101 during which another molding, recess etch, and stacking operation may be performed. The host substrate may be any known to be suitable for one or more of flip-chip packages (FCBGA), package-on-package (PoP), system-in-package (SiP), embedded wafer-level ball grid array (eWLB), wafer-level chip-scale packaging (WLCSP), or the like. In some embodiments, the substrate is a printed circuit board (PCB) compatible with Surface Mount Technology (SMT). The PCB may then be integrated in to any electronic device, such as, but not limited to a mobile device (e.g., a communication handset).

Figure 4A:
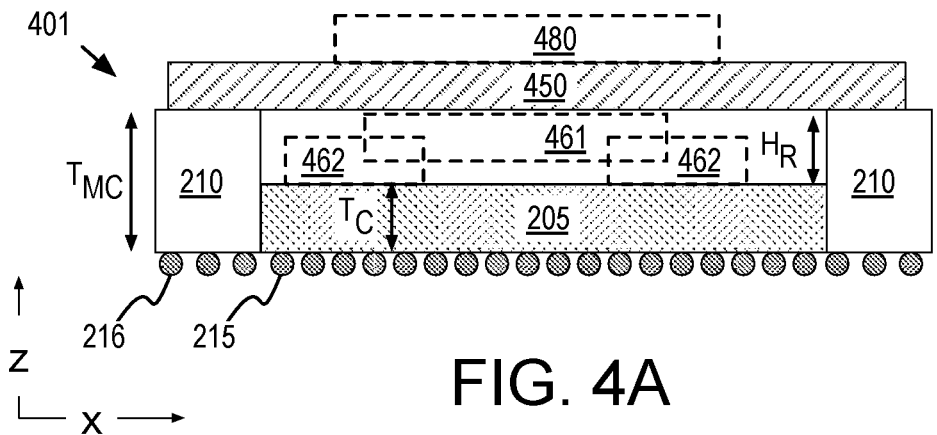
FIGS. 4A, 4B, and 4C depict cross-sectional views of a package assembly including a recessed IC chip, in accordance with some embodiments.
Figure 4B:
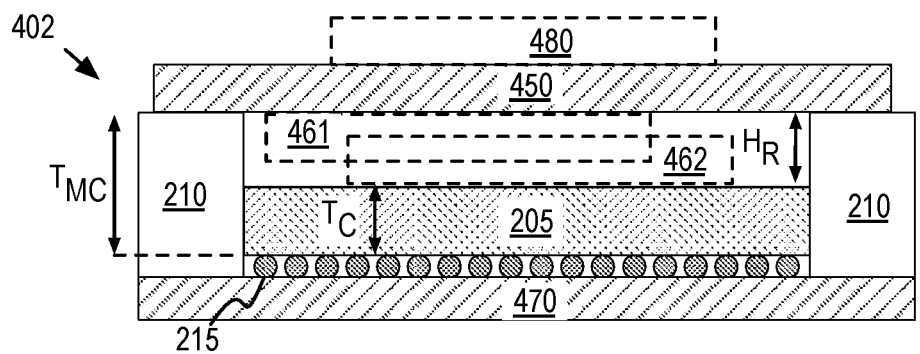
Figure 4C:
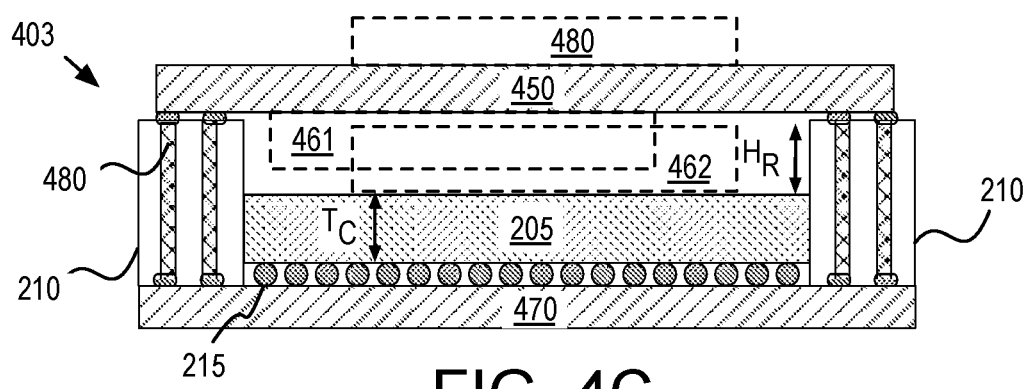

FIGS. 4A, 4B, and 4C depict cross-sectional views of packaged IC assemblies including a recessed IC chip, in accordance with some embodiments. In FIG. 4A, packaged IC assembly 401 includes a center-molded IC chip 205 with first solder features 215 electrically coupled to metal features on a front side of IC chip 205. Second solder features 216 are electrically coupled to metal features (e.g., a redistribution layer) on, or embedded in, a front side of molding compound 210. Solder features 216 may include a Sn—Ag—Cu (SAC) alloy, such as SAC 305 or 405. The diameter and pitch of solder features 215 and 216 may scale with technology, and in some embodiments are Cu pillar/solder cap microbumps having a diameter less than 100 μm (e.g., 40-50 μm). As shown, the front side surface of molding compound 210 is substantially planar with the front side surface of IC chip 205, with solder features 215, 216 forming a bump or ball grid array as might be generated by eWLB packaging flow. Although not illustrated in FIG. 4A, through molding vias, substantially as described below in the context of FIG. 4C, may also be included in packaged IC assembly 401.

In FIG. 4B, packaged IC assembly 402 includes a center-molded IC chip 205 with first solder features 215 electrically coupled to metal features on a front side of IC chip 205 and flip-chip bonded to a FC package substrate 470, which is to be subsequently thermal-compression bonded to a PCB, for example. FC Package substrate 470 serves as a base substrate for package assembly 402 with the front side surface of molding compound 210 substantially planar with solder features 215 and contacting package substrate 470. For such FC package embodiments, molding compound 210 has a z-thickness $T_{MC}$ (as measured from the chip front side demarked by dashed line) that is equal to the sum of chip z-thickness $T_C$ and recess height $H_R$. Although not illustrated in FIG. 4A, through molding vias, substantially as described below in the context of FIG. 4C, may also be included in packaged IC assembly 401.

In FIG. 4C, packaged IC assembly 403 includes a center-molded IC chip 205 with first solder features 215 electrically coupled to metal features on a front side of IC chip 205 and flip-chip bonded to FC package substrate 470. Through-mold conductive vias 480 pass through the molding z-thickness to electrically interconnect substrates 450 and 470. Any known through-mold via (TMV) process may be employed to form TMVs 480. Likewise, any solder reflow or other attachment process may be employed to form the packaged IC assembly 403.

In the exemplary embodiments illustrated in FIG. 4A-4C, the stacked component includes a package substrate 450 that is attached to the back side of molding compound 210, thereby forming a PoP assembly. Package substrate 405 may be positioned and attached by any known technique, such as pick-and-place. A recess of height $H_R$ is present over a back side of IC chip 205, substantially as described above. Disposed within the recess between package substrate 450 and IC chip 205 is a second IC chip, heat spreader, heat sink, etc. that is attached to package substrate 450, attached to IC chip 205, or attached to both substrate 450 and IC chip 205. For example, in FIG. 4A, dashed box 461 represents a second IC chip, heat spreader, heat sink, etc. that is attached to package substrate 450 while dashed box(es) 462 represent second IC chip(s), heat spreader(s), heat sink(s), etc. that are attached to IC chip 205. In some further embodiments, third IC chip(s), heat spreader(s), heat sink(s), etc., illustrated in FIG. 4A-4C as dashed box 480, may also be attached to a side of package substrate 450 opposite substrate 470.

Figure 5A:
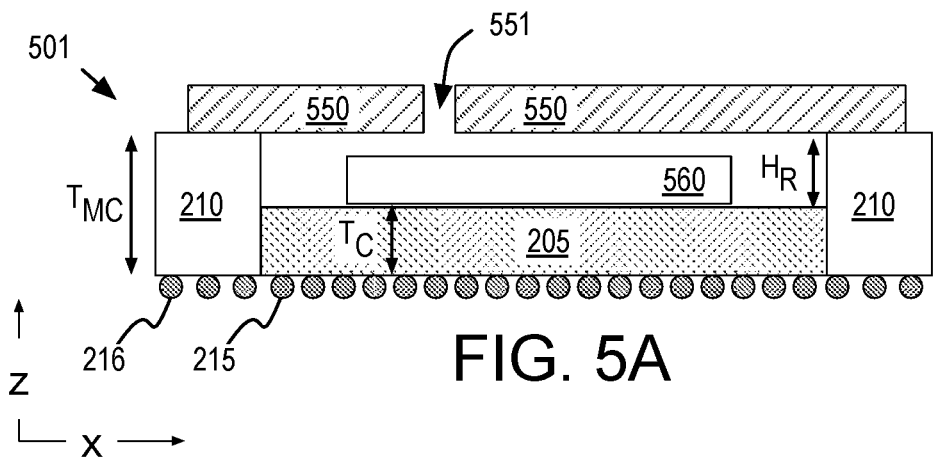
FIGS. 5A, 5B, and 5C depict cross-sectional views of a package assembly including a recessed IC chip, in accordance with some embodiments.

In some embodiments, a MEMs or other sensor (e.g., camera, etc.) is stacked over a recessed chip in a molded package assembly. The recess framed by the molding compound may be utilized to house the sensor and a package cap attached over the sensor to either seal the recess, or provide an opening to the recess suitable for sensor operation. For example, as shown in FIG. 5A, an eWLB package assembly 501 includes a recessed IC chip 205. IC chip 205 is center-molded within molding compound 210. Solder features 215 and 216 form a grid array suitable for electrical connection to any host substrate. Solder features 215 and 216 may be microbumps or solder balls, for example. A sensor (e.g., MEMs or CMOS optical sensor) 560 is stacked over IC chip 205. A packaging cap 550 is then affixed to the back side of molding compound 210, which provides a stand-off for cap 550. A sensor access hole 551 and/or lens stack may be provided by cap 550 as needed for operation of sensor 560.

Figure 5B:
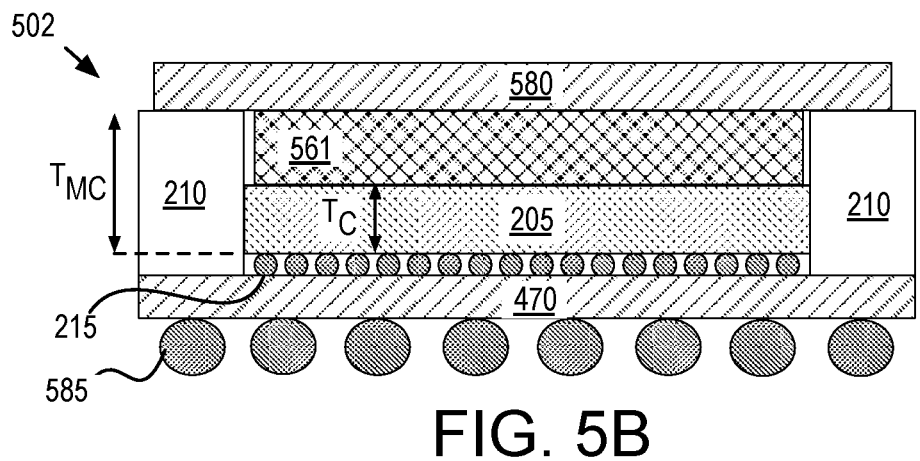

In some embodiments, a heat spreader and/or heat sink is stacked over a recessed chip in a molded package assembly. The recess framed by the molding compound may be utilized to house the spreader and/or sink which may be fully contained within the recess, or extend beyond of confines of the package molding compound, for example to thermally couple the packaged IC chip(s) to a heat sink external to the packaged assembly. In some embodiments shown in FIG. 5B, a FC package assembly 502 includes recessed IC chip 205. IC chip 205 is flip-chip bonded to a first side of package substrate 470. Solder features 215 (e.g., microbumps, solder balls, etc.) make electrical connection between the first side of package substrate 470 and the front side of IC chip 205. IC chip 205 is center-molded within molding compound 210. The structure illustrate in FIG. 5B is subsequent to application of solder to package assembly 502, hence the second side of package substrate 470 further includes an array of solder features 585 to coupled PoP assembly 502 to a host substrate (e.g., PCB). Solder features 585 may be bumps or balls, for example, and may have a larger diameter and/or pitch that solder features 215. In some embodiments, solder features 585 have a pitch over 100 µm.

The back side of IC chip 205 is recessed relative to a back side of molding compound 210. A metal block 561 is stacked over IC chip 205 and may function as a heat spreader, for example to mitigate the formation of hot spots within IC chip 205. Metal block 561 may be any metal with sufficient thermal conductivity (e.g., Cu) and may be plated (e.g., by electrolytic or electroless deposition) onto the recessed back side of IC chip 205, or may be mounted (e.g., by pick-and-place) to the recessed back side of IC chip 205. Metal block 561 is further attached to heat sink 580. For pick-and-place embodiments, metal block 561 may be first bonded to heat sink 580 and this sub-assembly positioned as a unit onto the back side of molding compound 210 with heat sink 580 then bonded to IC chip 205 and/or molding compound 210. For embodiments where metal block 501 is plated, the plating may proceed to fully backfill the recess framed by molding compound 210. The plated block and/or any plating overburden may then be polished back and heat sink 580 bonded to block 561.

Figure 5C:
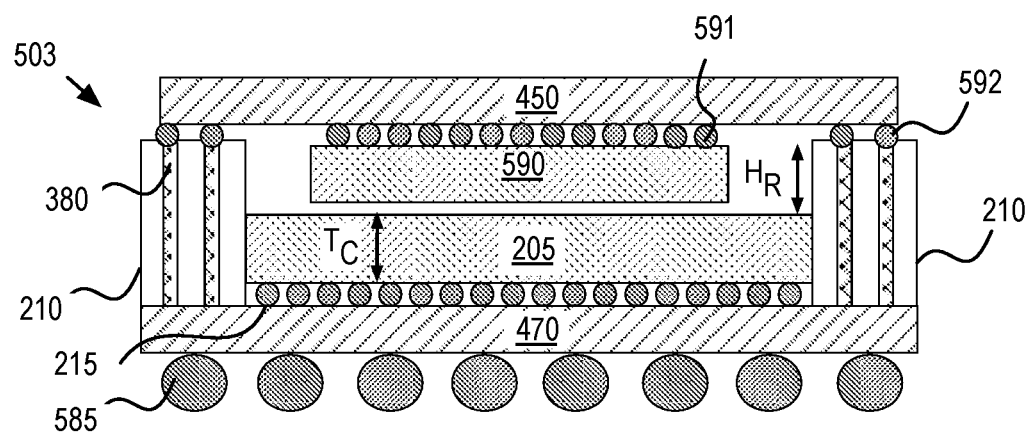

In some embodiments, a pair of FC-bonded packaged IC chips are stacked back-to-back with a first of the packaged chips at least partially occupying the recess framed by molding compound surrounding the second of the package chips. FIG. 5C depicts a cross-sectional view of a PoP assembly 503 including a recessed IC chip, in accordance with some exemplary embodiments. As shown, IC chip 205 is flip-chip bonded to a first side of package substrate 470. Solder features 215 (e.g., microbumps, solder balls, etc.) make electrical connection between the first side of package substrate 470 and the front side of IC chip 205. IC chip 205 is center-molded within molding compound 210. The back side of IC chip 205 is recessed relative to a back side of molding compound 210. A second IC chip 590 is flip-chip bonded to a first side of package substrate 450. Solder features 591 (e.g., microbumps, solder balls, etc.) make electrical connection between the first side of package substrate 450 and the front side of IC chip 590. Substrate 450 is electrically connected to metal features in molding compound 210. In the illustrative embodiment, the front side of substrate 450 is attached to through-molding vias 380 by solder features 592 (e.g., microbumps, solder balls, etc.). Through-molding vias 380 make electrical connection to the first side of package substrate 470. For example, through-molding vias 380 may be copper that has been plated through the molding compound from a metal surface of the package substrate 470. The opposite side of package substrate 470 further includes an array of solder features 585 (e.g., bumps, balls, etc.) to couple PoP assembly 503 to a host substrate (e.g., PCB). In some further embodiments, a third IC chip (not depicted) is attached to a second (back) side of package substrate 450, opposite IC chip 590.

Figure 5D:
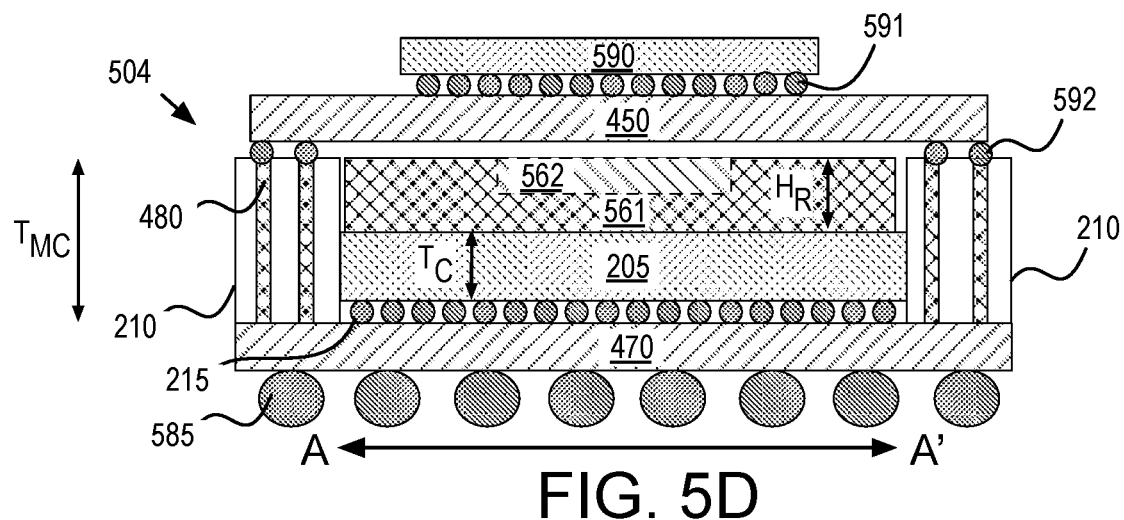
FIGS. 5D and 5E depict a cross-sectional view and plan view, respectively, of a package assembly including a recessed IC chip, in accordance with some embodiments.

In some embodiments, both a heat spreader and an IC chip are stacked over a chip recessed from a surrounding molding compound. FIG. 5D depicts a cross-sectional view of a package assembly 504, in accordance with some embodiments. As shown, IC chip 205 is flip-chip bonded to a first side of package substrate 470. Solder features 215 (e.g., microbumps, solder balls, solder paste, etc.) make electrical connection between the first side of package substrate 470 and the front side of IC chip 205. IC chip 205 is center-molded within molding compound 210. The back side of IC chip 205 is recessed relative to a back side of molding compound 210. A metal block 561 is stacked over IC chip 205 and may function as a heat spreader, for example to mitigate the formation of hot spots within IC chip 205. Metal block 561 may occupy substantially all of the recess height $H_R$, as illustrated. Any metal with sufficient thermal conductivity (e.g., Cu) may be plated (e.g., by electrolytic or electroless deposition) onto the recessed back side of IC chip 205, or may be mounted in bulk (e.g., by pick-and-place) to the recessed back side of IC chip 205. IC chip 590 is attached to a first (front) side of package substrate 450. In the illustrative FC embodiment, an array of solder features 591 (e.g., microbumps, solder balls, solder paste, etc.) make electrical connection between the package substrate 450 the front side of IC chip 590. A second (back) side of substrate 450 is electrically connected to metal features in molding compound 210. In the illustrative embodiment, the back side of substrate 450 is attached to through-molding vias 380 by solder features 592. Solder feature 592 may be microbumps or balls, for example. Through-molding vias 380 make electrical connection to the first side of package substrate 470. For example, through-molding vias 380 may be copper that has been plated through openings in the molding compound from a metal surface on package substrate 470. The second side of package substrate 470 further includes an array of solder features 585 to couple PoP assembly 504 to a host substrate (e.g., PCB). Solder features 585 may be bumps or balls, for example.

Figure 5E:
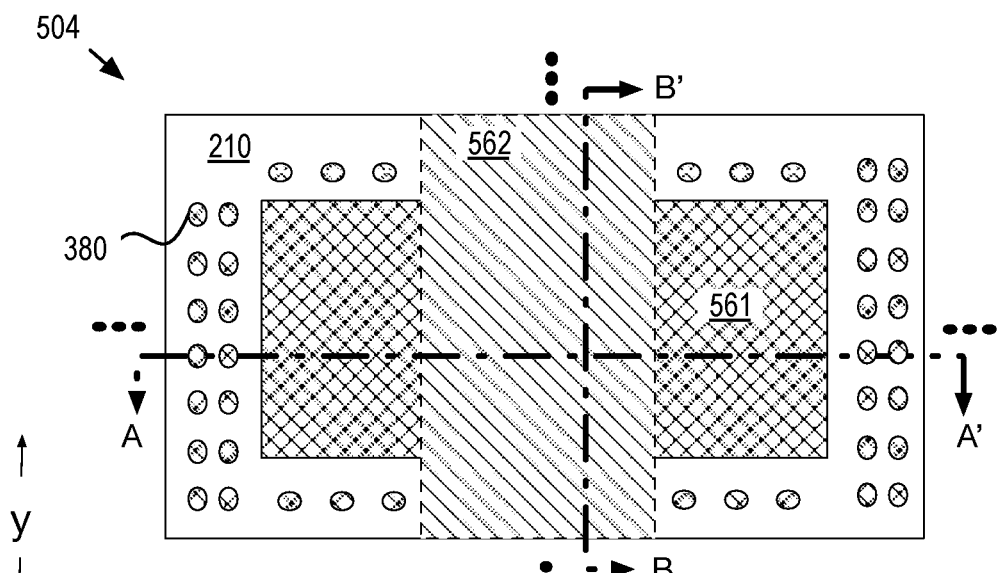
Figure 5F:
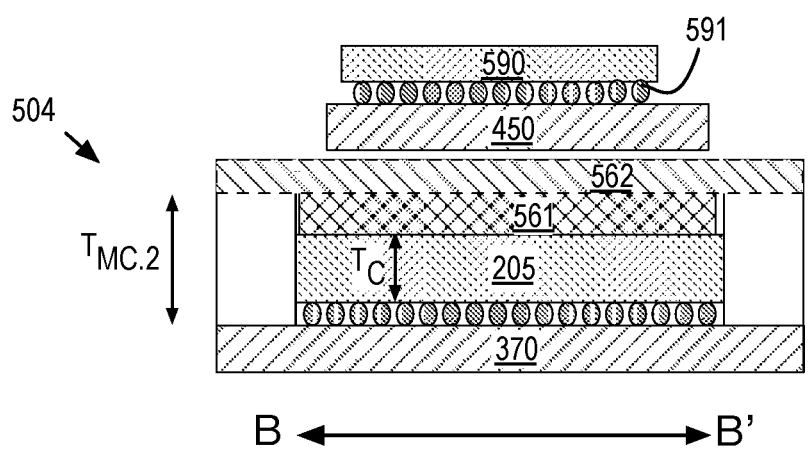
FIG. 5F depicts a second cross-sectional view of a package assembly as illustrated in FIGS. 5D and 5E, in accordance with some embodiments.

In some embodiments, a metal block occupying a recess over an IC chip that is framed by molding compound extends through a channel in the molding compound to couple with a heat sink external to the package assembly. A metal block disposed in the recess within package assembly 504, for example, may optionally extend through a channel in the molding compound outlined as dashed line portion 562 in FIG. 5D. FIG. 5E is a plan view of one such embodiment. In FIG. 5E, metal block 561 along the A-A' plane may be substantially as illustrated in FIG. 5D. A cross-sectional view of the B-B' plane in FIG. 5E is further illustrated in FIG. 5F. As shown, metal block region 562 extends through a channel in molding compound 210 where the compound has a reduced z-thickness $T_{MC,2}$ (i.e., $T_{MC,2} < T_{MC}$). Metal block region 562 is to provide a path of low thermal resistance to a heat sink (not depicted) that is external of package assembly 504. Depending on the fabrication technique, metal block region 562 may be a homogenous portion of metal block 561, or may be a second block that has been attached to metal block 561. For example, in one embodiment, a channel in molding compound 210 is formed by sawing or laser ablating partially through the molding compound z-thickness $T_{MC}$ from the back side. Such a channel may be shallow, advantageously avoiding contact with recessed IC chip 205, and may be formed before or after the IC chip recess is backfilled with metal. If the channel is formed first, a homogeneous metal block 561 may be positioned to occupy both the recess and channel, or multiple blocks may be iteratively attached (e.g., by pick-and-place). Alternatively, a homogeneous metal block 561 may be plated to backfill both the recess framed by the molding compound and the channel passing through a portion of the molding compound. If the channel is formed after the recess has been backfilled with heat spreader metal, the backfilled metal may be channeled as well, for example by a saw. Alternatively, where the molding compound is selectively ablated, the metal backfilled in the chip recess may not be channeled. Whatever the extent of the channel, it may be subsequently backfilled with metal (e.g., Cu), for example with a plating process. Any plating overburden may then be planarized down to be flush with the backside of molding compound 210, if desired.

Figure 6:
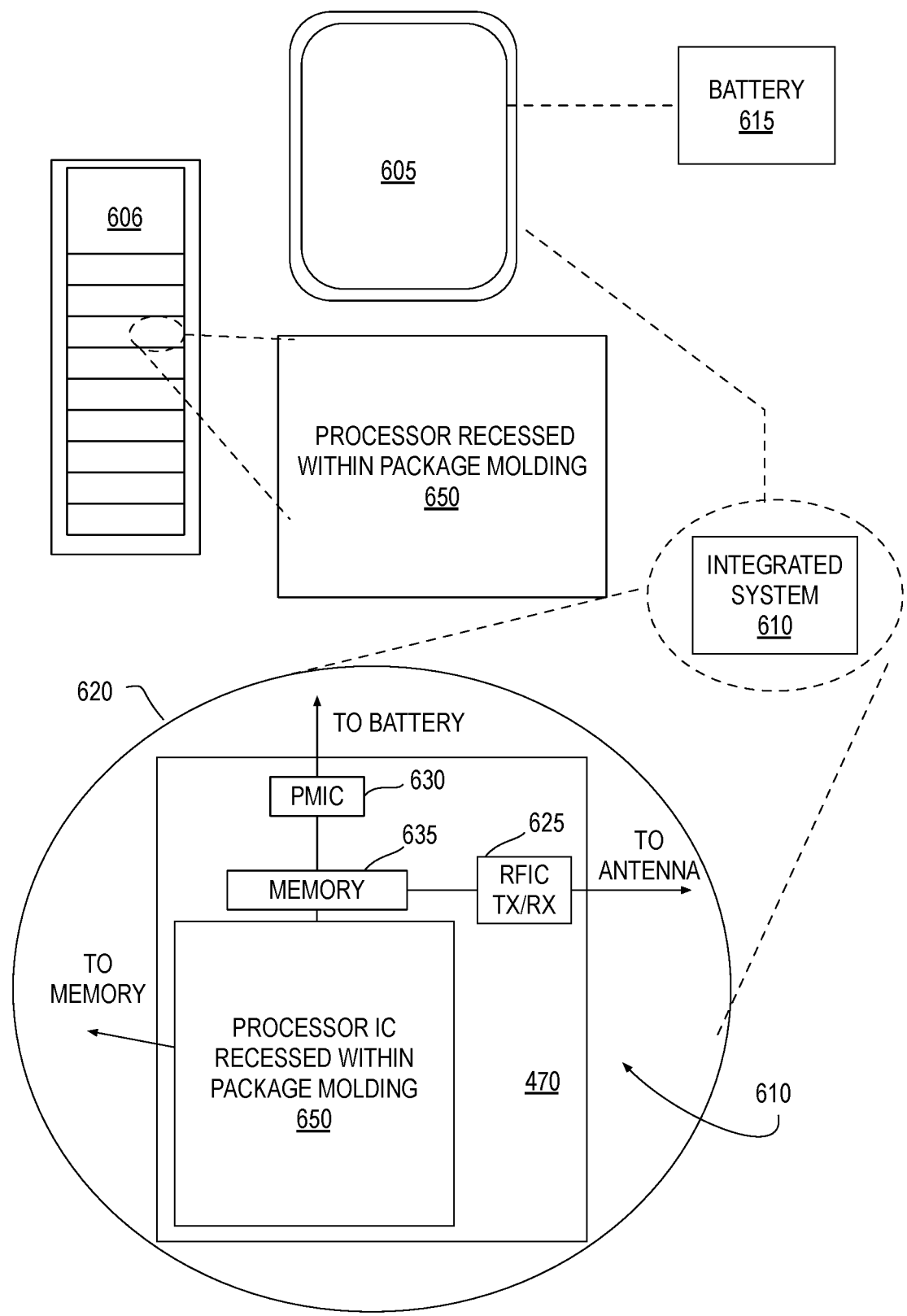
FIG. 6 illustrates a mobile computing platform and a data server machine employing a microprocessor and/or memory chip recessed in a package molding, in accordance with embodiments.

FIG. 6 illustrates a mobile computing platform 605 and a data server machine 606, each employing a package including a molded IC chip with recessed back side, for example as described elsewhere herein. In some embodiments, mobile computing platform 605 and/or data server machine 606 includes a PoP assembly having stacked components including a molded IC chip with recessed back side, for example as described elsewhere herein. Server machine 606 may be any commercial server, for example including any number of high-performance computing platforms disposed within a rack and networked together for electronic data processing, which in the exemplary embodiment includes a packaged monolithic SoC 650. Mobile computing platform 605 may be any portable device configured for each of electronic data display, electronic data processing, wireless electronic data transmission, or the like. For example, mobile computing platform 605 may be any of a tablet, a smart phone, laptop computer, etc., and may include a display screen (e.g., a capacitive, inductive, resistive, or optical touchscreen), a package-level integrated system 610, and a battery 615.

Within integrated system 610 further illustrated in the expanded view 620 a monolithic IC 650 includes a processor block (e.g., a microprocessor, a multi-core microprocessor, graphics processor, or the like). IC 650 is on a semiconductor chip that is packaged in a mold compound and has a back side recessed from that of the mold compound, for example as described elsewhere herein. The packaged IC 650 may be further coupled to a base package substrate 470 with one, or more, of an RF (wireless) integrated circuit (RFIC) 625 including a wideband RF (wireless) transmitter and/or receiver (TX/RX) (e.g., including a digital baseband and an analog front end module further comprising a power amplifier on a transmit path and a low noise amplifier on a receive path), and a memory chip 635 (e.g., DRAM, flash memory, or the like). RFIC 625 and/or memory chip 635 may be stacked into a package assembly to occupy at least a portion of the recess framed by the mold compound, for example as described elsewhere herein. Package substrate 470 may then be attached to a PCB within server machine 606 or mobile platform 605.

RFIC 625 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond.

Figure 7:
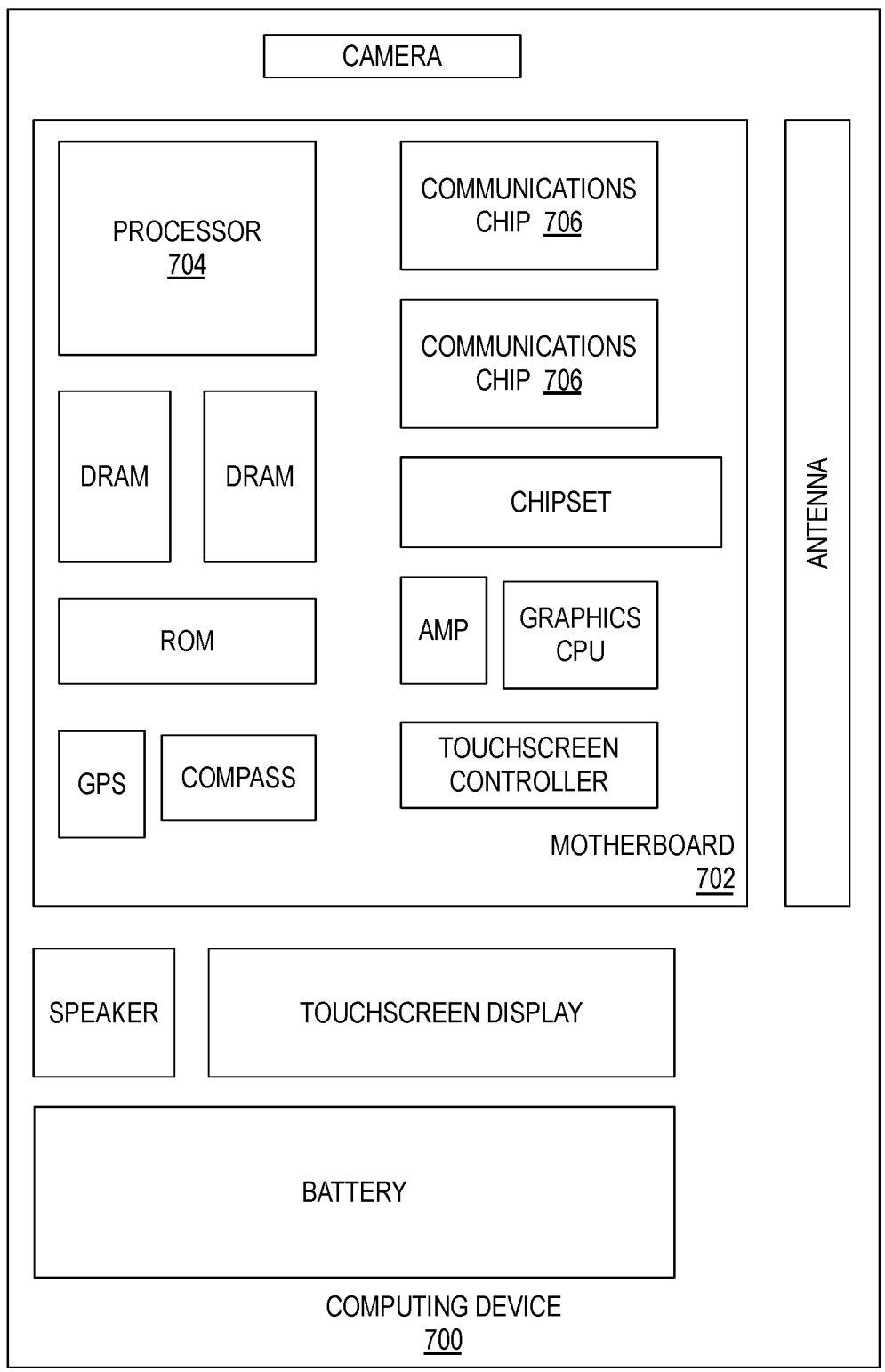
FIG. 7 is a functional block diagram of an electronic computing device, in accordance with some embodiments.

FIG. 7 is a functional block diagram of an electronic computing device, in accordance with some embodiments. Computing device 700 may be found inside mobile platform 605 or server machine 606, for example. Device 700 further includes a motherboard 702 hosting a number of components, such as, but not limited to, a processor 704 (e.g., an applications processor), which may be in a package assembly coupled to motherboard 702 and include a recessed molded chip, for example as described elsewhere herein. Processor 704 may be physically and/or electrically coupled to motherboard 702. In some examples, processor 704 is 3D integrated with a second IC chip into a PoP configuration with the second IC chip disposed within a recess framed by compound molded around processor 704, for example as described elsewhere herein. Processor 704 may be any device or portion of a device that processes electronic data from registers and/or an electronic memory to transform that electronic data into other electronic data that may be further stored in registers and/or memory.

In various examples, one or more communication chips 706 may also be physically and/or electrically coupled to the motherboard 702. In some implementations, communication chips 706 may be part of processor 704, or packaged with processor 704. Depending on its applications, computing device 700 may include other components that may be physically and electrically coupled to motherboard 702 or integrated into a package of processor 704. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera. Other component coupled to motherboard 702 may further include a mass storage device (such as hard disk drive, solid-state drive (SSD), compact disk (CD), digital versatile disk (DVD), or the like.

Communication chips 706 may enable wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 706 may implement any of a number of wireless standards or protocols, including but not limited to those described elsewhere herein. As discussed, computing device 700 may include a plurality of communication chips 706. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others. One or more of the communication chip 706 may be integrated into the package of one or more of the other components of device 700, for example as described elsewhere herein.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In first examples, an integrated circuit (IC) package assembly comprises a first IC chip including a front side having a plurality of first metal features, and a back side separated from the front side by a chip z-thickness. The assembly further comprises a molding compound framing the first IC chip, and the back side of the first IC chip is recessed from a back side of the molding compound. The assembly further comprises a stacked component at least partially occupying a recess over the first IC chip back side and framed by the molding compound.

In second examples, for any of the first examples the molding compound has a front side planar with the chip front side, and a molding z-thickness is greater than the chip z-thickness.

In third examples, for any of the first or second examples the package assembly further comprises a first package substrate coupled to the first metal features by first solder features, and second metal features disposed on a front side of the molding compound, the second metal features coupled to the first package substrate by second solder features.

In fourth examples, for any of the first, second or third examples the second metal features comprise conductive vias extending through the molding z-thickness.

In fifth examples, for any of the first, second, third, or fourth examples the package assembly further comprises a first package substrate coupled to the first metal features.

In sixth examples, for any of the first, second, third, fourth, or fifth examples the molding compound contacts the first substrate, and has a z-thickness that is greater than the chip z-thickness added to the z-height of the first solder features.

In seventh examples, for any of the first, second, third, fourth, fifth, or sixth examples the stacked component comprises at least one of a second IC chip or a metal heat spreader disposed over the first IC chip and framed by the molding compound.

In eighth examples, for any of the first, second, third, fourth, fifth, sixth or seventh examples the package assembly further comprises conductive vias extending through the molding z-thickness, and the stacked component comprises a second IC chip soldered to a package substrate, and the substrate is further soldered to the conductive vias.

In ninth examples, for any of the eighth examples both the first and second IC chips are framed by the molding compound.

In tenth examples, for any of the eighth or ninth examples the package assembly further comprises a heat spreader disposed between the first and second IC chips, the heat spreader framed by the molding compound and in contact with at least one of the first and second IC chips.

In eleventh examples, for any of the tenth examples the heat spreader extends through a channel in a back side of the molding compound.

In twelfth examples, a method of assembling an integrated circuit (IC) package, the method comprises receiving a first IC chip having a front side including a plurality of first metal features, and a back side separated from the front side by an initial chip z-thickness. The method comprises casting a molding compound around a perimeter of the first IC chip. The method comprises recess etching the IC chip back side relative to a back side of the molding compound. The method comprises stacking a component over the recessed back side of the first IC chip.

In thirteenth examples, for any one of the twelfth examples casting of the molding compound planarizes the back side of the compound with the back side of the first IC chip, and recess etching the IC chip back side further comprises etching a thickness of semiconductor with a wet chemical etchant or reactive ion etching process.

In fourteenth examples, for any one of the twelfth or thirteenth examples, the method further comprises forming electrical connections between the first metal features and a first package substrate, forming electrical connections between the first package substrate and second metal features disposed on a front side of the molding compound.

In fifteenth examples, for any one of the twelfth, thirteenth or fourteenth examples stacking the component further comprises at least one of placing a second IC chip or a metal heat spreader within a recess over the first IC chip and framed by the molding compound.

In sixteenth examples, for any one of the twelfth, thirteenth, fourteenth, or fifteenth examples the method further comprises forming conductive vias in the molding compound, the vias extending between the back side of the compound and a front side of the compound. Stacking the component comprises forming electrical connections between a second IC chip and a package substrate, and forming electrical connections between the package substrate and the conductive vias.

In seventeenth examples, for any one of the twelfth, thirteenth, fourteenth, fifteenth or sixteenth embodiments, the method further comprises forming a metal heat spreader within a recess over the first IC chip that is framed by the molding compound.

In eighteenth examples, for any of the seventeenth examples the method further comprises sawing a channel into the back side of the molding compound, and forming the metal heat spreader further comprises depositing metal into the channel.

In nineteenth examples a mobile device comprises a battery, and a package-on-package (PoP) assembly electrically coupled to the battery. The PoP package assembly further comprises a first integrated circuit (IC) chip flip-chip bonded to a first package substrate and center-molded within a molding compound, with a back side of the IC chip recessed from a back side of the molding compound. The PoP package assembly further comprises a second IC chip flip-chip bonded to a second package substrate. The second package substrate is electrically connected to the first package substrate and the second IC chip occupying a recess over the first IC chip back side that is framed by the molding compound.

In twentieth examples, for any one of the nineteenth examples at least one of the first or second IC chips includes processor circuitry.

In twenty-first examples, for any one of the nineteenth or twentieth examples at least one of the first or second IC chips includes DRAM circuitry.

In twenty-second examples, a mobile device comprises a battery, and a package-on-package (PoP) assembly electrically coupled to the battery. The PoP package assembly further comprises the IC package assembly in any one of the first examples.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of assembling an integrated circuit (IC) package, the method comprising:
   receiving an IC chip having a front side including a plurality of first metal features, and a back side separated from the front side by an initial chip z-thickness;
   forming a molding compound around a perimeter of the IC chip, wherein forming the molding compound contacts a sidewall of the IC chip with the molding compound;
   recessing the IC chip back side relative to a back side of the molding compound by removing a thickness of a semiconductor substrate with a process that exposes a sidewall of at least some of the molding compound that was in contact with a portion of the sidewall of the IC chip; and
   stacking a component having a smaller area than that of the IC chip within a recess over the recessed back side of the IC chip and spaced apart from the sidewall of the molding compound.

2. The method of claim 1, further comprising:
   forming electrical connections between the first metal features and a first package substrate; and
   forming electrical connections between the first package substrate and second metal features that are over a front side of the molding compound.

3. The method of claim 1, wherein stacking the component further comprises placing at least one of a second IC chip, or a MEMs device, or a metal heat spreader within a recess over the IC chip, and framed by the molding compound.

4. The method of claim 1, further comprising:
   forming conductive vias in the molding compound, the vias extending between the back side of the compound and a front side of the compound; and
   wherein the stacking the component comprises:
      forming electrical connections between a second IC chip and a package substrate; and
      forming electrical connections between the package substrate and the conductive vias.

5. The method of claim 1, wherein stacking the component further comprises placing a metal block within the recess.

6. The method of claim 5, further comprising stacking another component over the metal block, on a side of the heat spreader opposite the IC chip.

7. The method of claim 6, wherein stacking another component comprises stacking a second IC chip over the metal block.

8. The method of claim 7, wherein stacking the second IC chip over the metal block further comprises attaching a package substrate to the back side of the molding compound.

9. The method of claim 1, further comprising coupling the IC chip to a power supply.

10. A method of assembling an integrated circuit (IC) package, the method comprising:
    forming a molding compound around a perimeter of an IC chip, the IC chip having a front side including a plurality of first metal features, and a back side separated from the front side by a chip z-thickness, wherein forming the molding compound around a perimeter of an IC chip contacts a sidewall of the IC chip with the molding compound;
    reducing the chip z-thickness by reducing a thickness of a semiconductor substrate with a recessing process that exposes at least some of the molding compound that was in contact with a portion of the sidewall; and
    stacking a second IC chip over the IC chip, wherein stacking the second IC chip over the IC chip comprises forming a heat spreader within a recess over the back side of the IC chip, and stacking the second IC chip over the heat spreader, on a side of the heat spreader opposite the IC chip.

11. The method of claim 10, wherein stacking the second IC chip over the IC chip comprises affixing a package substrate to the back side of the molding compound, the second IC chip attached to the package substrate.

12. The method of claim 11, further comprising:
    forming vias through the molding compound; and
    interconnecting the vias to interconnect features of the package substrate.

13. The method of claim 12, wherein interconnecting the vias to interconnect features of the package substrate comprises reflowing solder features.

14. The method of claim 10, further comprising forming a channel through a portion of the molding compound, wherein forming the heat spreader further comprises depositing metal with the recess and within the channel.

15. The method of claim 14, further comprising coupling the heat spreader to a heat sink external of the molding compound.

16. A method of assembling an integrated circuit (IC) package, the method comprising:
    forming a molding compound around a perimeter of a IC chip, the IC chip having a front side, and a back side separated from the front side by a chip z-thickness, wherein the forming contacts a sidewall of the IC chip with the molding compound;

reducing the chip z-thickness by removing, from a back side of the IC chip, a thickness of a semiconductor substrate with a recessing process that exposes at least some of the molding compound that was in contact with a portion of the sidewall; and stacking at least one of: a MEMs device, a second IC chip, or a heat spreader over the IC chip, at least a portion of the MEMs device, a second IC chip, or a heat spreader adjacent to, and spaced apart from, a sidewall of the molding compound exposed by the recessing of the IC chip back side.

17. The method of claim 16, wherein the stack further comprises stacking the MEMs device or the second IC chip over the IC chip, and wherein the method further comprises:
    forming vias through the molding compound; and
    interconnecting the vias to the MEMs device or second IC chip.

\* \* \* \* \*